(12) United States Patent
Jun et al.

(10) Patent No.: US 8,435,057 B1
(45) Date of Patent: May 7, 2013

(54) DUAL-CAM EJECTOR ASSEMBLY

(75) Inventors: Frank S. Jun, San Jose, CA (US); Hong Tran Huynh, Fremont, CA (US); Yewen Li, Suzhou (CN); Mohammad Reza Danesh Kadivar, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/301,892

(22) Filed: Nov. 22, 2011

(51) Int. Cl.
*H01R 13/62* (2006.01)
(52) U.S. Cl.
USPC .......................................................... 439/157
(58) Field of Classification Search ........... 439/157–160
See application file for complete search history.

(56) References Cited

U.S. PATENT DOCUMENTS

| | | | |
|---|---|---|---|
| 5,232,374 A * | 8/1993 | Iino ................................ | 439/157 |
| 5,765,933 A * | 6/1998 | Paul et al. .................. | 312/332.1 |
| 6,160,717 A | 12/2000 | Desousa et al. | |
| 6,379,167 B1 * | 4/2002 | Zhang et al. .................. | 439/157 |
| 6,853,556 B1 | 2/2005 | Myers et al. | |
| 7,121,866 B2 * | 10/2006 | Testa et al. ..................... | 439/347 |
| 7,297,008 B2 * | 11/2007 | Griffin ........................... | 439/157 |
| 7,438,571 B1 * | 10/2008 | Barina et al. ................... | 439/157 |
| 7,462,049 B2 * | 12/2008 | Chen et al. ..................... | 439/160 |
| 7,874,776 B1 | 1/2011 | Lam et al. | |
| 2002/0182909 A1 * | 12/2002 | Stathopoulos et al. ........ | 439/160 |

* cited by examiner

*Primary Examiner* — Chandrika Prasad
(74) *Attorney, Agent, or Firm* — Edell, Shapiro & Finan, LLC

(57) ABSTRACT

A dual-cam ejector assembly for a card, such as a line card, is provided. The ejector assembly comprises an elongated ejector arm having its distal end coupled to the line card so as to provide a first axis of rotation for the ejector arm. The ejector assembly further comprises an ejector cam coupled to the line card so as to provide a second axis of rotation for the ejector cam. The ejector assembly also comprises a cam pin extending from the ejector cam that couples the ejector cam to the ejector arm such that pivoting of the ejector arm around the first axis of rotation causes the ejector cam to pivot around the second axis of rotation.

23 Claims, 11 Drawing Sheets

DUAL-CAM EJECTOR ASSEMBLY

TECHNICAL FIELD

The present disclosure relates to an ejector assembly for a card, such as a line card.

BACKGROUND

Electrical components are typically mounted onto a printed circuit board to form a "card" for insertion into the housing of a computing system or other electronic device. These cards have electrical edge connectors which enable the electrical components on the card to be electrically connected to components in the computing system. More specifically, a chassis, box housing of a computing system will include one or more slots or sockets that are configured to receive the card. Within these slots is mounting hardware that mechanically mates with the surface of the card, as well as electrical connectors that electrically mate with the electrical edge connectors of the card. In order to ensure proper mechanical/electrical mating, a card is typically inserted into a slot with a substantial amount of force. Similarly, the electrical/mechanical mating may make it difficult to remove the card from the slot, again requiring the application of a substantial amount of force.

There are a number of different types of cards that are configured to be inserted into a slot of a computing system or other electronic device. These card include, but are not limited to, line cards, Personal Computer (PC) cards (e.g., Personal Computer Memory Card International Association (PCMCIA) card or other memory card), different types of expansion cards, etc. These cards generally provide some type of added functionality to the computing system and are inserted into, or removed from, the slot of the computing system as desired.

DESCRIPTION OF EXAMPLE EMBODIMENTS

Overview

Figure 1:
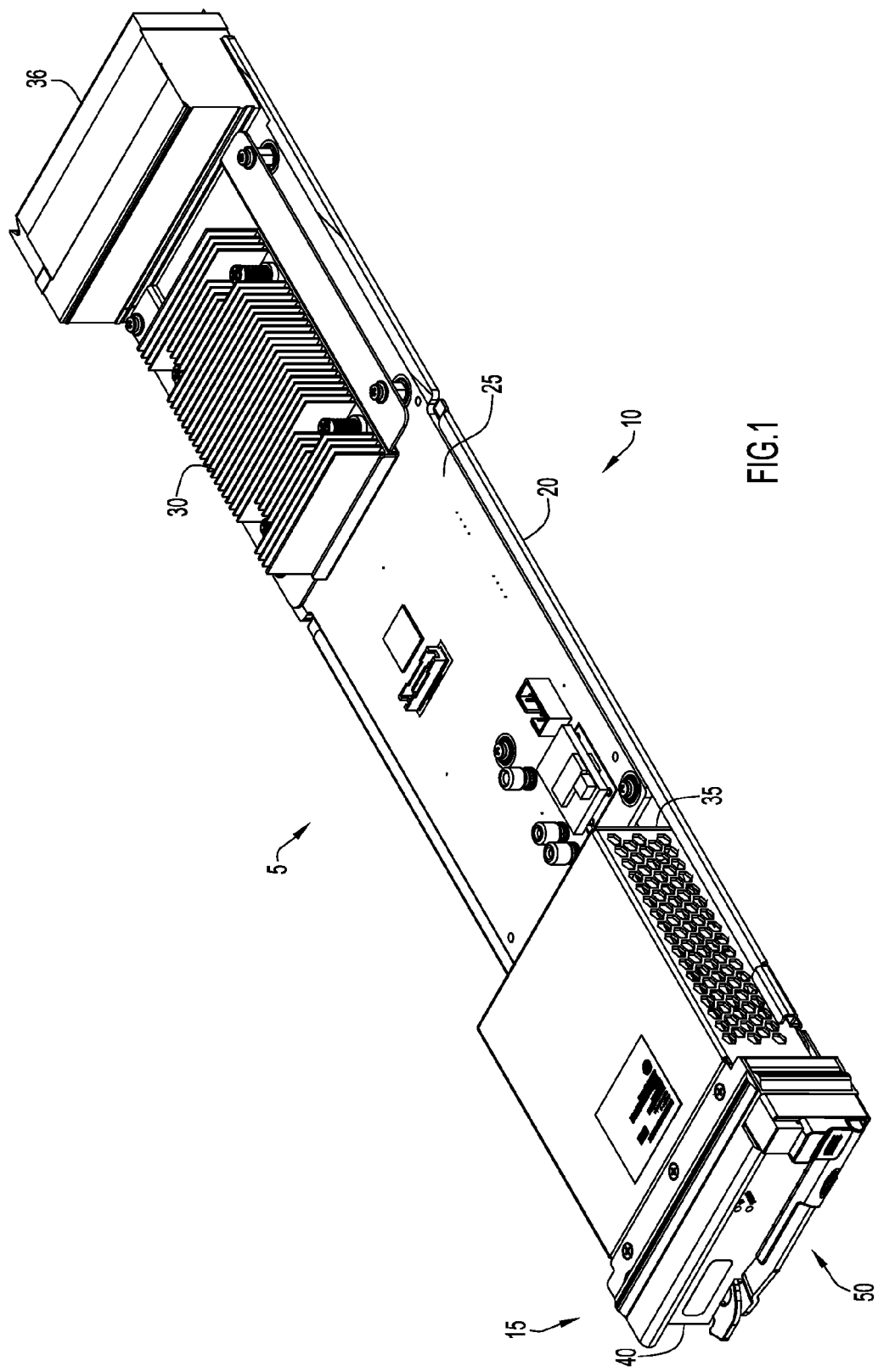
FIG. 1 is a perspective view of a line card having a dual-cam ejector assembly as described herein.

A dual-cam ejector assembly for a card, such as a line card, is provided. The ejector assembly comprises an elongated ejector arm having its distal end coupled to the line card so as to provide a first axis of rotation for the ejector arm. The ejector assembly further comprises an ejector cam coupled to the line card so as to provide a second axis of rotation for the ejector cam. The ejector assembly also comprises a cam pin extending from the ejector cam that couples the ejector cam to the ejector arm such that pivoting of the ejector arm around the first axis of rotation causes the ejector cam to pivot around the second axis of rotation.

EXAMPLE EMBODIMENTS

There are a number of different types of cards that are configured to be inserted into a slot of a computing system housing or other electronic device (e.g., line cards, PC cards, etc.) For ease of references, examples will be described herein with reference to a line card configured to be inserted into a slot of a computing system, such as a slot in a computing system rack.

Line cards typically include an ejector assembly to assist in the insertion/removal of the line card. The ejector assemblies generally include one or two ejector arms mounted to a front panel (i.e., the edge of the card opposite the electrical edge connectors) of the line card by a single pivot point. The pivoting action of these handles provides the force needed to connect/disconnect the edge connectors to/from the electrical connectors in the slot. The use of two ejector arms reduces the risk of accidental removal of the line card by operators (since both ejector arms need to be actuated to remove the line card) and minimizes the force that is required by an operator to disconnect the edge connectors from the backplane.

A line card generally includes a large number of edge connectors that electrically connect with the backplane of a computing system (through electrical connectors in a card slot). As the number of electrical connections increases, the force that is required to mate/disconnect the line card to/from the backplane also increases. In conventional arrangements, the length of the ejector arm is directly correlated to the length of the lever arm. That is, the longer the arm, the more torque that is created through the rotation of the ejector arm, and thus the more force that is created for insertion/removal of the line card. Therefore, in conventional arrangements, the ejectors arms are typically substantially long to enable generation of the needed forces.

While the number of electrical connections between a line card and a computing system has been increasing, the size of line cards, and the size of computing systems in general, has been decreasing. The need for the increased insertion/removal forces, coupled with these space limitations, has reduced the effectiveness and ability to use conventional ejector assemblies. Examples described herein are directed to a new ejector assembly in which the force that may be applied is not limited by the length of the ejector arm. Rather, as detailed elsewhere herein, the new ejector assembly makes use of a dual-cam mechanism that is configured to use a dual-pivoting motion to increase the force that is applied through rotation of an ejector arm. That is, the dual-cam mechanism is configured to provide a mechanical advantage that allows a shorter ejector arm to provide insertion/removal forces that exceed the forces applied through conventional arrangements.

FIG. 1 is a perspective view of an example line card 5 that is configured to be inserted into a slot of a computing system (not shown in FIG. 1). Line card 5 includes a main body 10 attached to a front section 15.

Main body 15 comprises structural support 20 that may be, for example, a support plate, opposing support rails, etc.

Disposed or mounted on structural support 20 is a printed circuit board assembly (PCBA) 25 (i.e., a printed circuit board (PCB) having electronic components attached thereto to form a functional assembly). It is to be appreciated that a number of different electronic components may be provided in PCBA 25. One example electronic component shown in FIG. 1 is a heat sink 30.

Main body 10 also includes a box 35 that may house one or more other electronic components, and a backplane connector 36. Backplane connector 36 comprises one or more electrical edge connectors that are configured to electrically mate with electrical connectors provided in a receiving slot of the computing system.

Front section 15, attached to main body 10, includes a face plate 40. Attached to front section 15 is, among other elements, a dual-cam ejector assembly 50. Further details of front section 15 and dual-cam ejector assembly 50 are provided below.

Figure 2A:
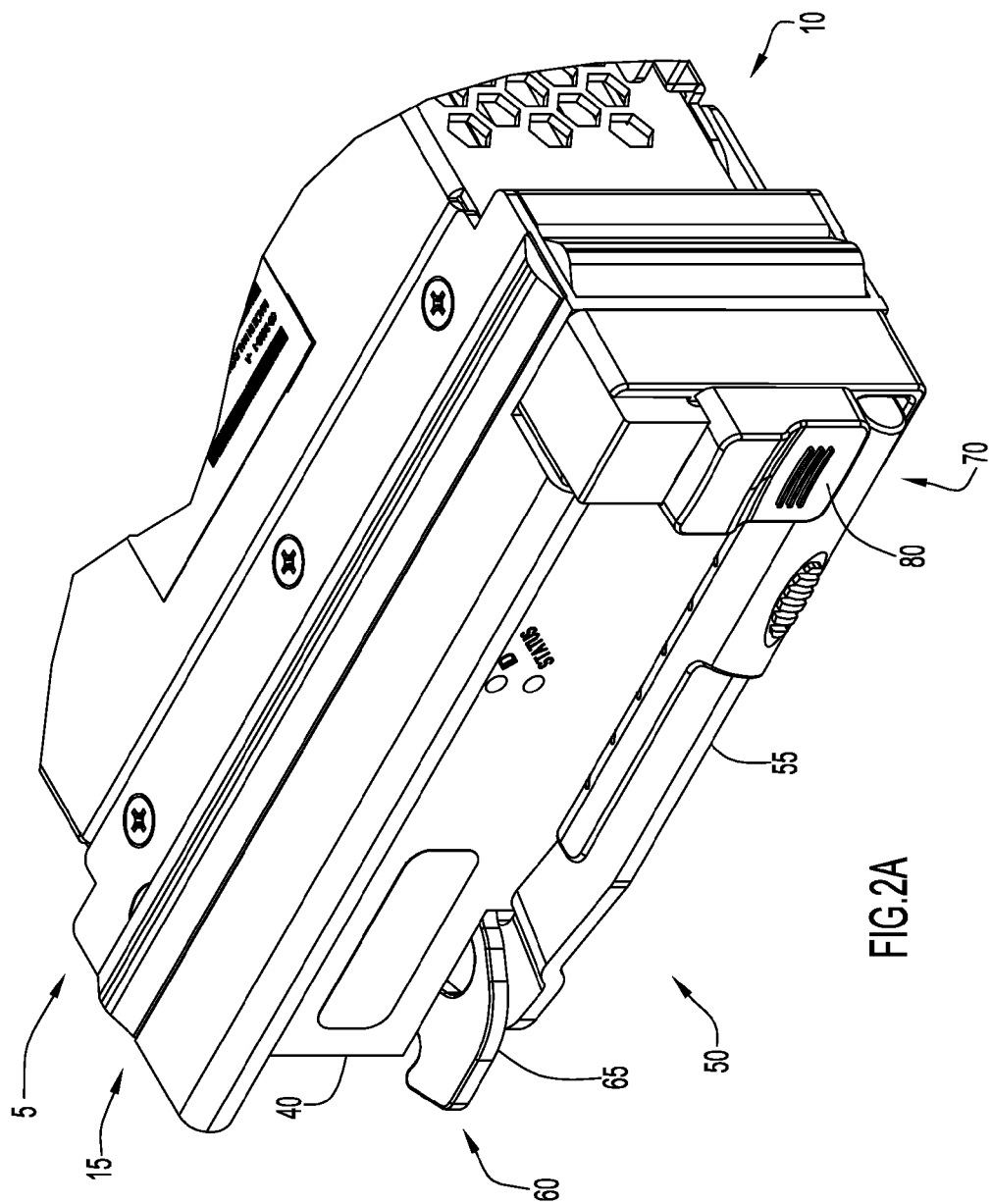
FIG. 2A is a perspective view of a front section of the line card having the dual-cam ejector assembly in a closed position.
Figure 2B:
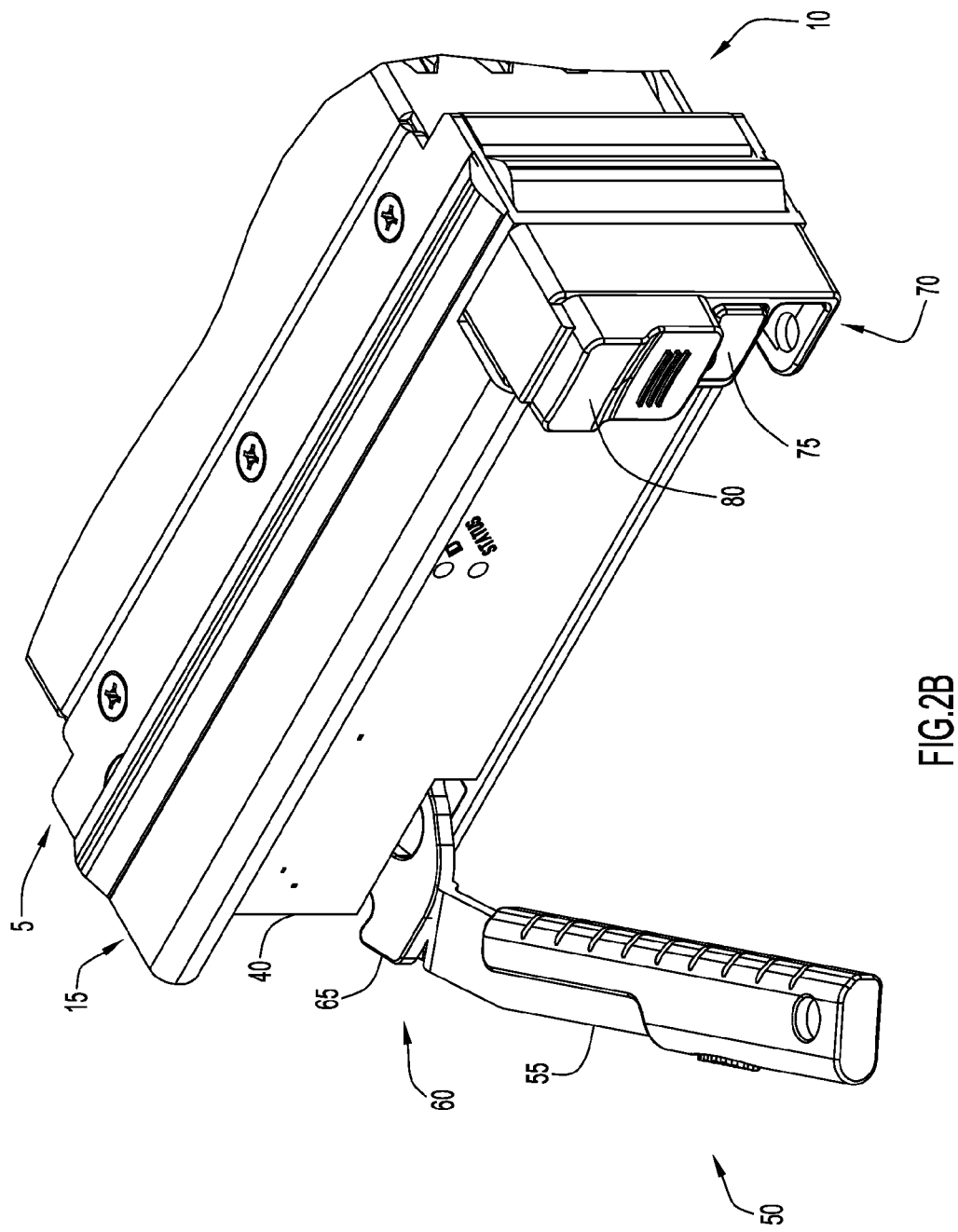
FIG. 2B is a perspective view of the front section of the line card having the dual-cam ejector assembly in an open position.

FIGS. 2A and 2B are perspective views of the front section 15 of line card 5. Front section 15 includes the ejector assembly 50 that comprises an ejector lever arm 55, referred to herein simply as the ejector arm 55, and a dual-cam mechanism 60. Dual-cam mechanism 60 comprises an ejector cam 65, lever arm pivot rivet (not shown in FIGS. 2A and 2B), and an ejector cam pivot rivet (also not shown in FIGS. 2A and 2B).

Front section 15 of line card 5 also includes a lock mechanism 70 that comprises an ejector arm release button 75 (shown in FIG. 2B) and a spring-loaded protective button cover 80. In the example of FIG. 2A, protective button cover 80 is engaged and covers ejector arm release button 75.

In FIG. 2A, the ejector assembly 50 is a closed positioned. That is, as shown, ejector arm 55 is held in a locked positioned adjacent to face plate 40. However, in FIG. 2B, the ejector assembly 50 is shown in an open position in which the ejector arm 55 is separated from face plate 40. As described further below, when line card 5 is positioned in a slot of a computing system, rotation of the ejector arm 55 from the closed position of FIG. 2A to the open position of FIG. 2B causes ejector cam 65 to exert a force on a wall of the slot to disconnect the edge connectors in backplane connector 36 from the electrical connectors in the slot.

Figure 3:
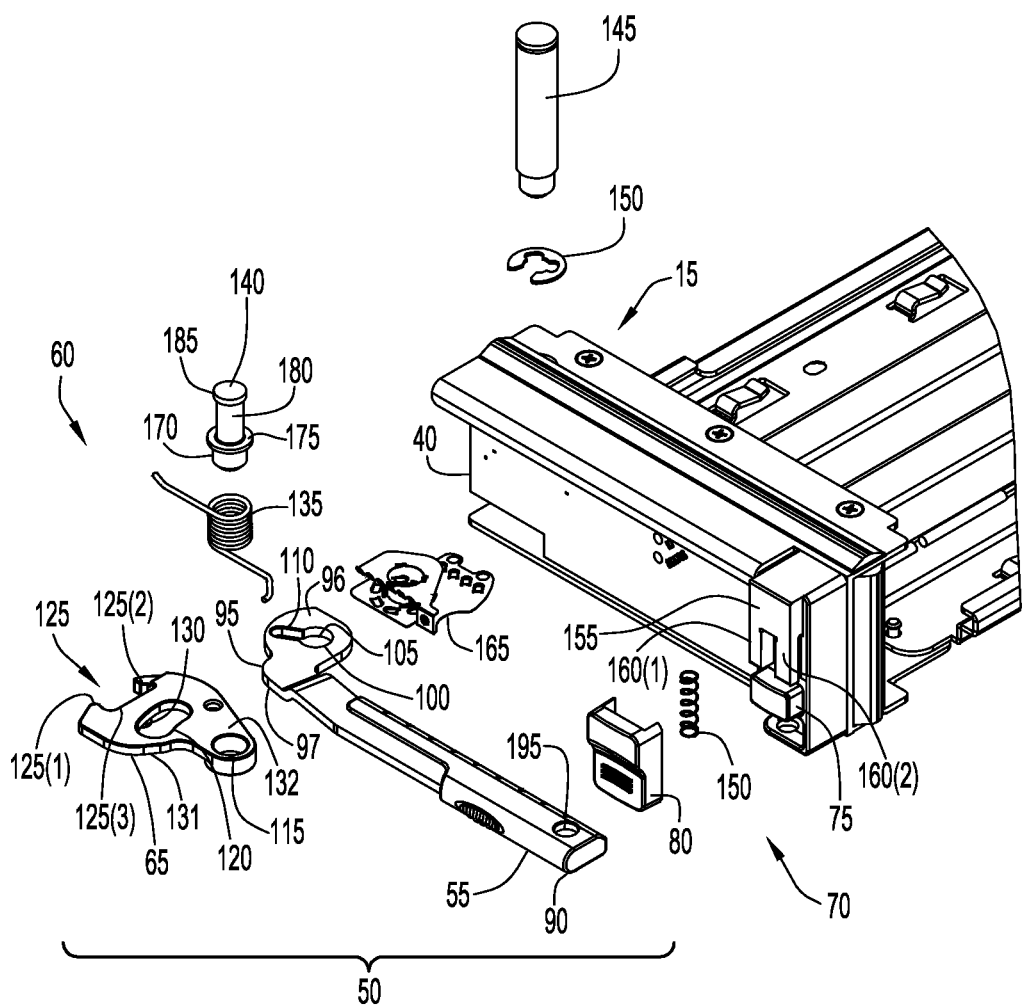
FIG. 3 is an exploded view of the dual-cam ejector assembly.

FIG. 3 is an exploded view of ejector assembly 50 illustrating the details of dual-cam mechanism 60 and of lock mechanism 70. As shown, a first element of ejector assembly 50 is ejector arm 55. Ejector arm 55 is an elongated member that has a proximal end 90 and a distal end 95. Distal end 95 is a substantially planar member having a general cam shape (i.e., the general shape of an irregular oval) and is sometimes referred to herein as distal cam 95. Distal cam 95 has an upper surface 96 and a lower surface 97. Distal cam 95 further comprises a key-hole slot 100. Key-hole slot 100 comprises a circular region (aperture) 105, referred to as pivot hole 105, and an elongated region 110 extending from the pivot hole. The distal cam 95 of elongated arm 55 is referred to herein as being an element of dual-cam mechanism 60.

Another element of dual-cam mechanism 60 is ejector cam 65. Ejector cam 65 is a substantially planar member having a general cam shape (i.e., the general shape of an irregular oval). Ejector cam 65 comprises a generally circular aperture 115, referred to as pivot hole 115, and a curved slot 120 having a generally kidney-bean or fabiform shape. Disposed in the outer surface of ejector cam 65 is a jaw 125. In this example, jaw 125 is a generally rectangular slot comprising first and second opposing surfaces 125(1) and 125(2), respectively, and a third surface 125(3). It is to be appreciated that surfaces 125(1), 125(2), and 125(3) may have different shapes (e.g., flat, concave, convex), curvatures, textures, etc., as desired to perform the operations of jaw 125 described below. As such, the generally rectangular shape of jaw 125 includes, for example, shapes in which the first and second surfaces 125(1) and 125(2) are parallel and shapes in which any of surfaces 125(1)-125(3) include concavities or convexities. Ejector cam 65 further comprises a cam pin 130 extending from the bottom surface 131 of the ejector cam.

As shown in FIG. 3, ejector assembly 50 also comprises a coil spring 135, an ejector cam pivot rivet 140, an ejector arm pivot rivet 145, and a lock washer 150.

In the example of FIG. 3, the distal cam (end) 95 of ejector arm 55 is pivotably coupled to front section 15 by ejector arm pivot rivet 145 such that ejector arm 55 rotates around a first axis of rotation. When the ejector assembly 50 is assembled, ejector arm pivot rivet 145 extends through pivot hole 105 and mates with an opening (not shown in FIG. 3) in front section 15. Lock washer 150 may be positioned around ejector arm pivot rivet 145 to retain the distal cam 95, and the rest of ejector arm 55, in position. As such, ejector arm 55 rotates around the ejector arm pivot rivet 145, and the ejector arm pivot rivet 145 provides the first axis of rotation for the ejector arm. An electromagnetic interference (EMI) shielding gasket 165 may also be disposed about a portion of ejector arm pivot rivet 145 and a portion of ejector cam 65.

The ejector cam 65 is pivotably coupled to front section 15 by ejector cam pivot rivet 140 so as to rotate around a second axis of rotation. When the ejector assembly 50 is assembled, a lower portion 170 of ejector cam pivot rivet 140 extends through pivot hole 115 to mate with an opening (not shown in FIG. 3) in front section 15 such that flange 175 abuts the upper surface 132 of the ejector cam 65. As such, ejector cam 65 rotates around the ejector cam pivot rivet 140, and the ejector cam pivot rivet 140 provides the second axis of rotation for the ejector cam.

Additionally, when ejector assembly 50 is assembled, ejector cam 65 is disposed over (on top of) distal cam 95. In this assembled position, ejector arm pivot rivet 145 extends through curved slot 120, but slot 120 is shaped to allow substantially free movement of the ejector arm 55 around the ejector arm pivot rivet 145. Furthermore, the cam pin 130 extends from the lower surface 131 of ejector cam 65 into elongated region 100 of key-hole slot 100 to couple the ejector cam 65 to ejector arm 55.

Ejector cam pivot rivet 140 comprises an upper portion 180 extending between flange 175 and a cap flange 185. When the ejector assembly 50 is assembled, coil spring 135 is disposed around this upper portion 180.

FIG. 3 also shows an exploded view of lock mechanism 70. As noted above, lock mechanism 70 comprises the ejector release button 75 and the protective button cover 80. Lock mechanism 70 also comprises a coil spring 150 and a receiver 155 having opposing slide rails 160(1) and 160(2). When lock mechanism 70 is assembled, protective button cover 80 is configured to engage and slide with, and slide along, slide rails 160(1) and 160(2). Coil spring 150 is disposed inside receiver 155 and is configured to bias protective button cover 80 downwards so as to cover the ejector release button 75.

As noted above, the line card 5 of FIG. 3 is configured to be inserted into a slot of a computing system. When the line card 5 is fully inserted into such a slot, the ejector assembly 50 is in the closed position of FIG. 2A. While in the closed position, lock mechanism 70 retains ejector arm 55 adjacent to face plate 40. More specifically, a pin extends through aperture 195 in proximal end 90 of the ejector arm 55. The pin is held in place by ejector release button 75. The protective button cover 80 in lock mechanism 70 effectively eliminates the potential accidental release of the line card 5 by covering ejector release button 75.

When an operator desires to remove line card 5 from the slot, the operator first releases the ejector arm 55 from lock mechanism 70. That is, the operator slides protective button cover 80 upwards (against coil spring 150) along slide rails 160(1) and 160(2) to expose ejector release button 75. The operator then presses ejector release button 75 so that the pin is removed from aperture 195.

Coil spring 135 is disposed around ejector cam pivot rivet 140 and is configured to bias the ejector arm 55 away from the face plate 40. As such, when the ejector arm 55 is released by lock mechanism 70, the bias provided by coil spring 135 causes ejector arm 55 to rotate around ejector arm pivot rivet 145 (i.e., around the first axis of rotation) such that proximal end 90 moves a distance away from the face plate 40. The distance that proximal end 90 moves, and the magnitude (angular degree) of rotation around the first axis of rotation, may be based, at least in part, on the strength of coil spring 135 and the resulting bias placed on ejector arm 55.

In order to continue removal of line card 5 from the slot, the operator places a force on proximal end 90 of the ejector arm 55 to cause the ejector assembly 50 to take the open position of FIG. 2B. More specifically, the operator causes ejector arm 55 to continue its rotation around the first axis of rotation provided by ejector arm pivot rivet 145. As noted above, cam pin 130 extends from ejector cam 65 into elongated region 110 of key-hole slot 100. Therefore, as ejector arm 55 rotates, cam pin 130 engages (contacts) the sides of elongate region 110 and causes ejector cam 65 to rotate around the second axis of rotation provided by ejector cam pivot rivet 140. In other words, there is a transfer of force via cam pin 130 from ejector arm 55 to ejector cam 65, resulting in simultaneous rotation of the dual-cam mechanism 60 (and ejector assembly 50 in general) around two axes of rotation (i.e., rotation of ejector arm 55 around the first axis of rotation provided by ejector arm pivot rivet 145 and rotation of ejector cam 65 around the second axis of rotation provided by ejector cam pivot rivet 140).

As detailed further below, the rotation of ejector cam 65 causes the jaw 125 to exert a mechanical force on the computing system so as to disconnect the edge connectors in backplane connector 36 (FIG. 1) from the electrical connectors in the slot of the computing system. More particularly, the rotation of ejector cam 65 causes the first surface (edge) 125(1) of jaw 125 to engage a wall of the slot and place a force on the wall that is generally in the opposite direction of the rotation of ejector arm 55.

As a result of the dual-rotation (simultaneous rotation around two axes), the force applied by jaw 125 is a multiple of the torque that would be applied through simple rotation of a single-pivot ejector arm. More specifically, the ejector arm 55 and ejector cam cooperate to provide an increased mechanical force (i.e., a mechanical advantage).

As noted above, ejector assembly 50 is referred to herein as including dual-cam mechanism 60. The example arrangement described above is considered to include a dual-cam mechanism because there are two axes of rotation that impact the force output by the ejector cam jaw 125. In operation, the distal cam 95 of ejector arm 55 operates as, and performs the general functionality of, a first cam, while ejector cam 65 operates as, and performs the general functionality of, a second cam.

The dual-cam mechanism 60 is a relatively compact design that allows for higher output forces without the need for increasing the length of the ejector arm. Furthermore, because only one ejector arm is used, rather than two ejector arms (as in certain conventional arrangements), operators only need to use one arm, allowing for easier and faster card insertion/removal. In one specific example, an ejector assembly as described herein, such as ejector assembly 50, is configured to fit into a 4.5 inch wide front section of a line card (i.e., the length of the ejector arm 55 is approximately less than or equal to 4.5 inches). In this specific example, due to the use of the dual-cam mechanism 60, the mechanical insertion/removal force would be the same or greater than a traditional single-pivot ejector assembly having a lever arm that is at least 9 inches long.

Figure 4:
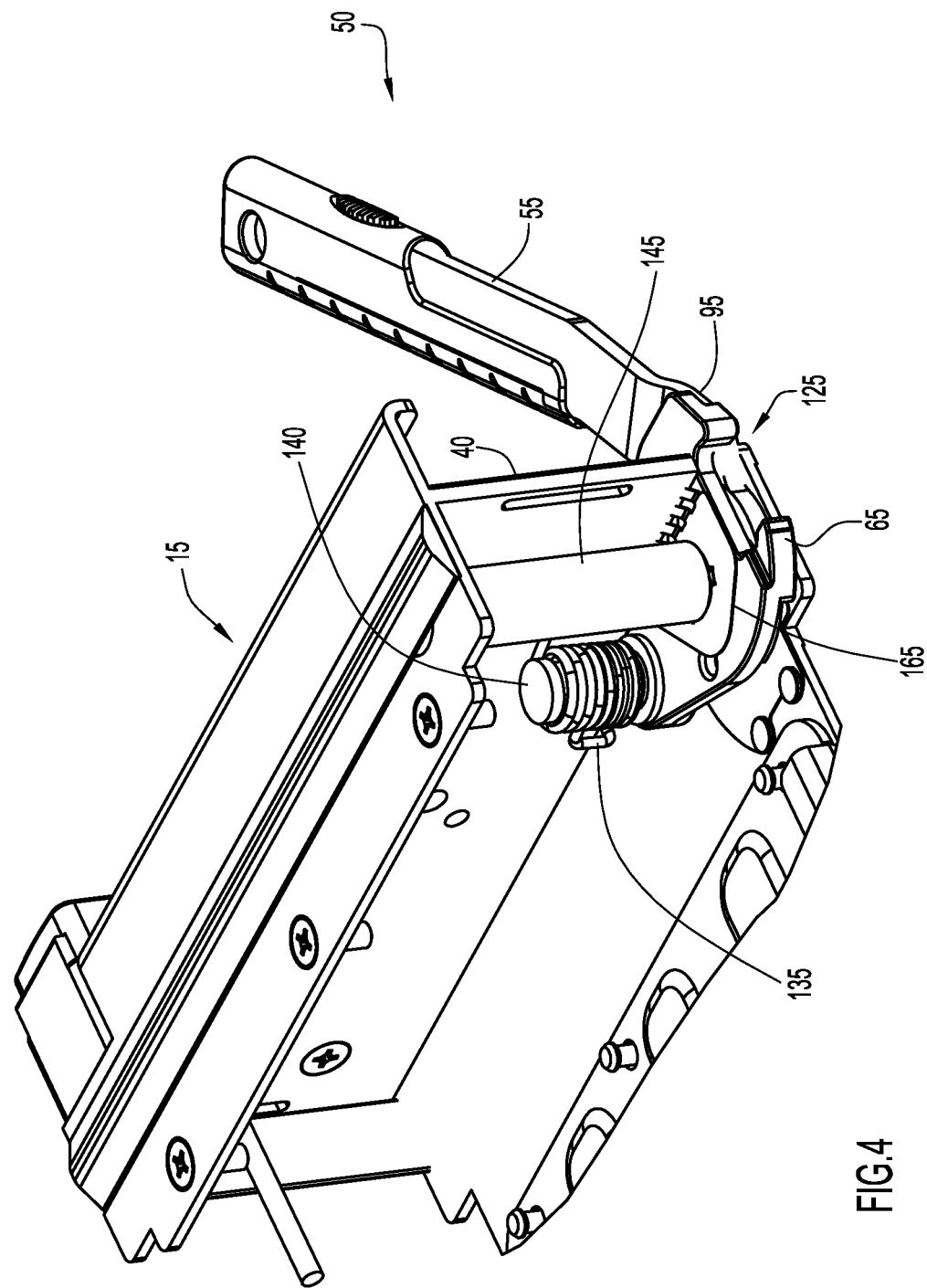
FIG. 4 is a rear perspective view of the front section of the line card having the dual-cam ejector assembly in an open position.

FIG. 4 is perspective view of the back of front section 15 of line card 5 showing ejector assembly 50 in an assembled arrangement. As shown, coil spring 135 is disposed around ejector cam pivot rivet 140 behind face plate 40.

Figure 5:
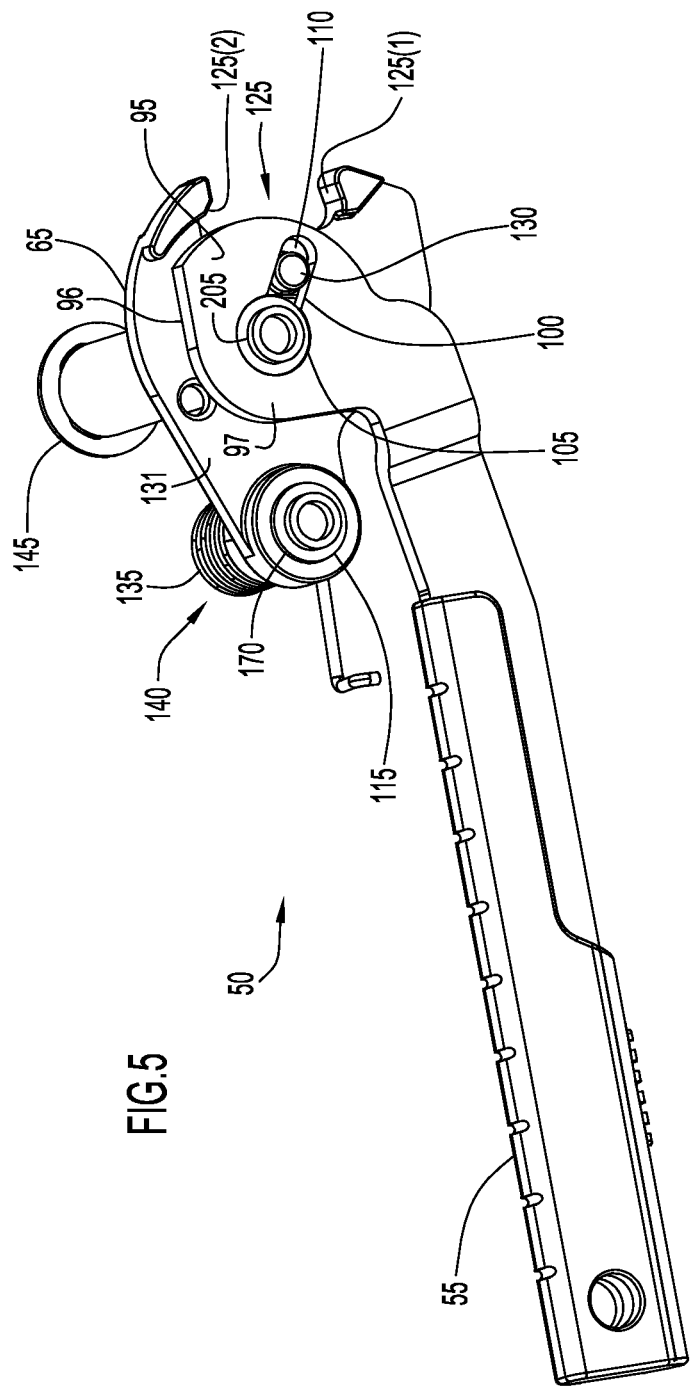
FIG. 5 is a bottom perspective view of the dual-cam ejector assembly.

FIG. 5 is a bottom view of ejector assembly 50 in an assembled arrangement. For ease of illustration, the front section 15 of line card 5 has been omitted from FIG. 5.

In the assembled arrangement of FIG. 5, the distal cam 95 of ejector arm 55 is positioned under ejector cam 65. More specifically, lower surface 131 of ejector cam 65 is positioned abutting the upper surface 96 of distal cam 95. Additionally, lower portion 170 of ejector cam pivot rivet 140 extends through pivot hole 115. Similarly, ejector arm pivot rivet 145, and more specifically a lower portion 205, extends through pivot hole 105 of key-hole slot 100.

As shown in FIG. 5, cam pin 130 protrudes from lower surface 131 of ejector cam 65 and extends through elongate region 110 of key-hole slot 100. Therefore, as noted above with reference to FIG. 3, when ejector arm 55 rotates around ejector arm pivot rivet 145 (i.e., the first axis of rotation), cam pin 130 contacts a side of elongate region 110 and transfers a rotational force to ejector cam 65 that causes the ejector cam to rotate around the ejector cam pivot rivet 140 (i.e., the second axis of rotation). In other words, the transferred force (via cam pin 130) results in simultaneous rotation of the ejector cam 65 and ejector arm 55 (i.e., dual-pivoting rotation of dual-cam mechanism 60 and ejector assembly 50 in general).

FIG. 5 further illustrates the details of jaw 125 of ejector cam 65. As previously noted, jaw 125 is a generally rectangular shaped slot in the outer surface of ejector cam 65 having three surfaces 125(1), 125(2), and 125(3) that may each have different shapes/configurations. In the example of FIG. 5, first surface 125(1) and second 125(2) each have a general concave shape. First surface 125(1) comprises a continuous curve to form the concave shape, while second surface 125(2) has an indent formed by one or more sharp turns.

Figure 6A:
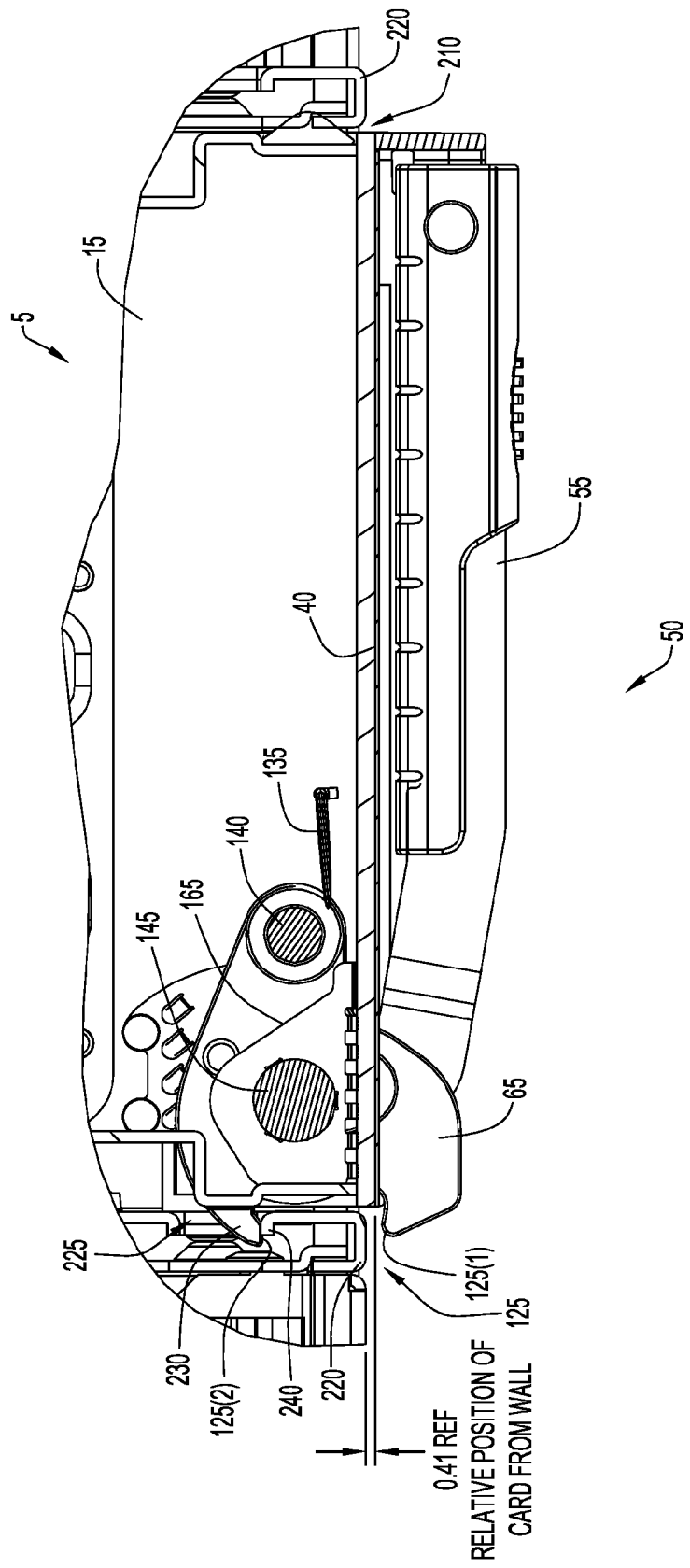
FIGS. 6A-6C are partially cross-sectional top views of the line card having the dual-cam ejector assembly that illustrate transitioning of the dual-cam ejector assembly from the closed position to the open position.
Figure 6B:
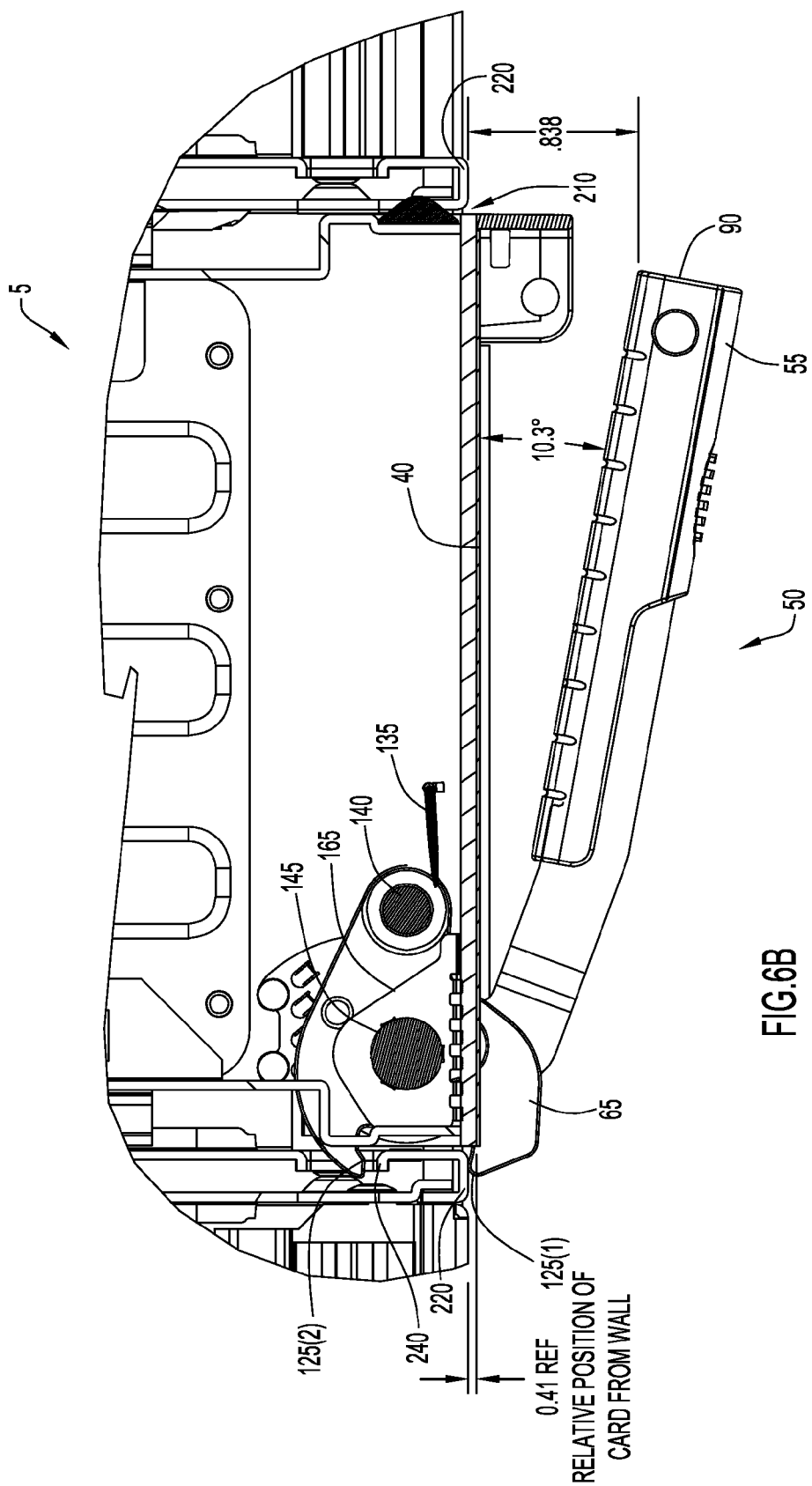
Figure 6C:
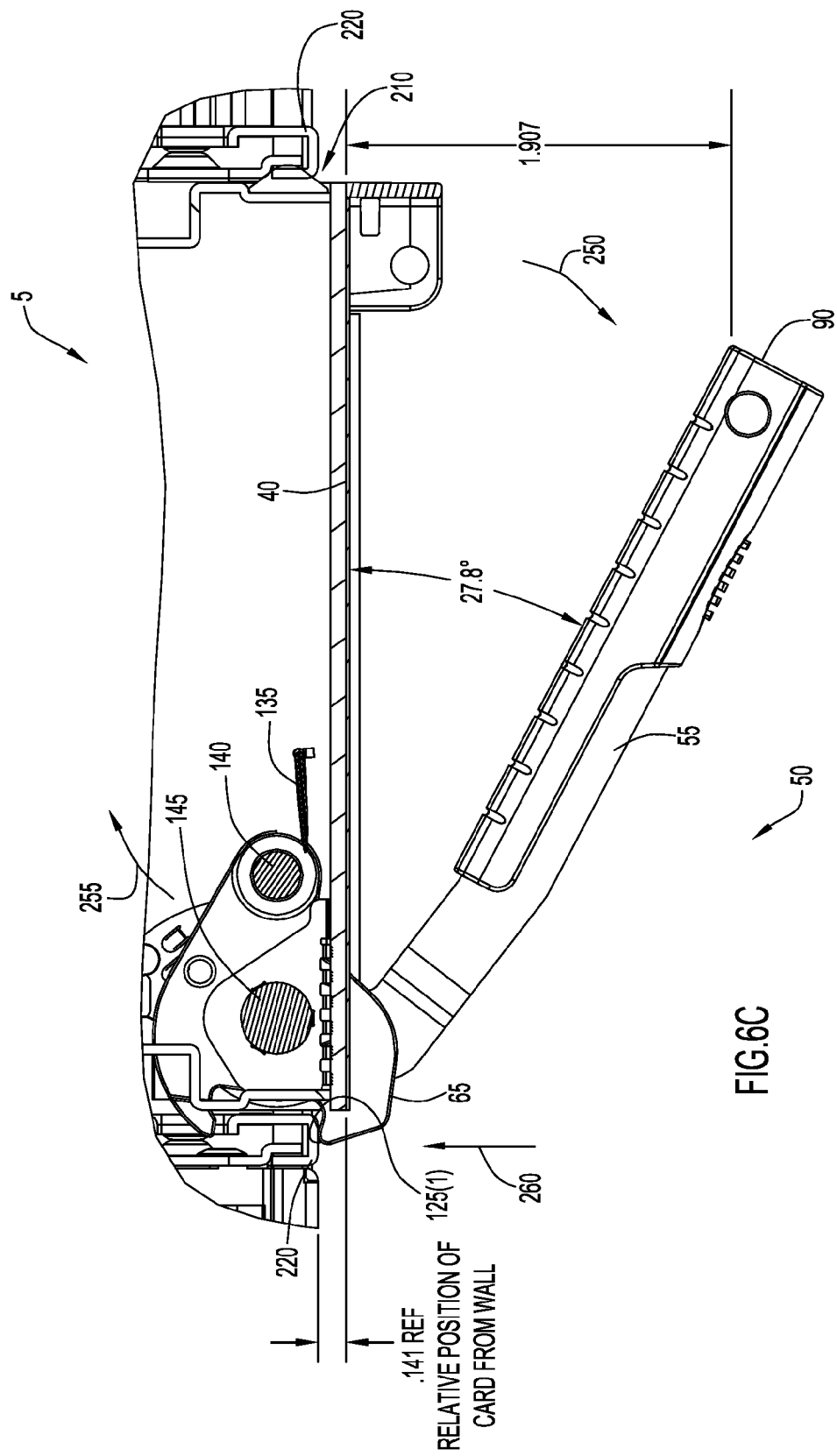

FIGS. 6A-6C are a series of top, cross-sectional views of front section 15 of line card 5. In these views the top of front section 15 has been omitted to illustrate the operation of ejector assembly 50. Additionally, these views shown line card 5 inserted into a slot 210 of a computing system. Surrounding slot 210 is a wall 220.

In FIG. 6A, ejector assembly 50 is in a locked position and line card 5 is fully inserted into slot 210. That is, the edge connectors in backplane connector 36 (FIG. 1) are electrically mated with electrical connectors in slot 210. As shown in FIG. 6A, when in this locked positioned, ejector assembly 50 is mated with wall 220 of slot 210. More specifically, wall 220 comprises a slot or opening 225 that is configured to receive a portion 230 of ejector cam 65, namely a portion 230 that is proximate to second surface 125(2) of jaw 125. When portion 230 is inserted into opening 225, second surface 125(2) of jaw 125 engages an edge 240 of the opening. As noted further below, during insertion of line card 5 into slot 210, second surface 125(2) is configured to exert a force on edge 240.

When ejector assembly 50 is in the locked position of FIG. 6A, face plate 40 of line card 5 may positioned a distance beyond the outer surface of wall 220. That is, in certain arrangements, when line card 5 is fully inserted into slot 210, the front of the card may extend from the slot 110 a certain distance. For illustration purposes only, the example of FIG. 6A shows face plate 40 starting a distance 0.041 inches in front of wall 220. The following examples of FIGS. 6B and 6C will make reference to the distance that face plate 40 is in front of wall 220 to illustrate how rotation of ejector arm 55 affects the position of line card 5 relative to slot 210. It is to be appreciated that these distances, and any referenced rotational angles, are merely illustrative of one specific example.

In the arrangement of FIG. 6B, an operator has unlocked ejector arm 55 by actuating lock mechanism 70, as described elsewhere herein. That is, the operator slid protective button cover 80 upwards to expose ejector release button 75, and then the operator pressed the ejector release button 75. As noted above, as a result of the bias on ejector arm 55 by coil spring 135, pressing the ejector release button 75 causes ejector arm 55 to rotate around ejector arm pivot rivet 145 (i.e., the first axis of rotation). In the example of FIG. 6B, ejector arm 55 rotates around the first axis of rotation by approximately 10.3 degrees, and the proximal end 90 of ejector arm is spaced from wall 220 by approximately 0.838 inches. Furthermore, the release of ejector arm 55 causes first surface 125(1) of jaw 125 to engage (contact) wall 220. In this position, line card 5 has not moved from slot 210. That is, face plate 40 is still approximately 0.041 inches in front of wall 220.

In the arrangement of FIG. 6C, the operator rotates ejector arm 55 around the first axis of rotation provided by ejector arm pivot rivet 145. This rotation is show by arrow 250. As shown, the operator rotates ejector arm 55 around the first axis of rotation provided by ejector arm pivot rivet 145 by 27.8 degrees from the initial closed position, thereby causing distal end 90 to be approximately 1.907 inches from the face plate 40. As previously noted, the rotation of ejector arm 55 causes rotation of ejector cam 65 (via the transfer of force through cam 130). The general direction of the rotation of ejector cam 65 is shown by arrow 255. The dual-rotation of ejector arm 55 and ejector cam 65 causes first surface 125(1) to exert a force on wall 220. The direction of this force is represented by arrow 260. The force on wall 220 causes line card 5 to move out of slot 210. As shown in FIG. 6C, after ejector arm 55 rotates the 27.8 degrees, line card 5 has moved out of slot 210 by approximately 0.1 inches from the fully inserted position and, as a result, the electrical connectors in backplane connector 36 are disengaged from the electrical connectors in slot 210.

As noted above, FIGS. 6A-6C illustrate the use of ejector assembly 50 to remove line card 5 from slot 210. However, as noted elsewhere herein, ejector assembly 50 may also be used to insert line card 5 into slot 210 and, more particularly, to provide sufficient force to mate the electrical connectors in backplane connector 36 with the electrical connectors provided in slot 210. During such insertion, ejector arm 55 is rotated around the first axis of rotation provided by ejector arm pivot rivet 145 in a direction opposite to arrow 250 (FIG. 6C). The rotation of ejector arm 55 is transferred to ejector cam 65 via cam pin 130, thereby causing rotation of ejector cam 65 around ejector cam pivot rivet 140 in the direction opposite to arrow 255 (FIG. 6C). As ejector cam 65 rotates, portion 230 of the ejector cam 65 enters opening 225 in wall 220 such that the second surface 125(2) engages (contacts) edge 240 of the opening 225. Second surface 125(2) is configured to come in contact with edge 240 while ejector arm 55 is spaced from face plate 40 (i.e., while there is still room for ejector arm 55 and ejector cam 65 to rotate). As such, as the dual-rotation of ejector arm 55 and ejector cam 65 continues, second surface 125(2) exerts a force on edge 240 substantially in the direction of face plate 40 (i.e., in the opposite direction of arrow 260 of FIG. 6C). This force causes line card 5 to move in an opposite direction (i.e., into slot 210) such that the electrical connectors in backplane connector 36 mate with the electrical connectors provided in slot 210.

Figure 7A:
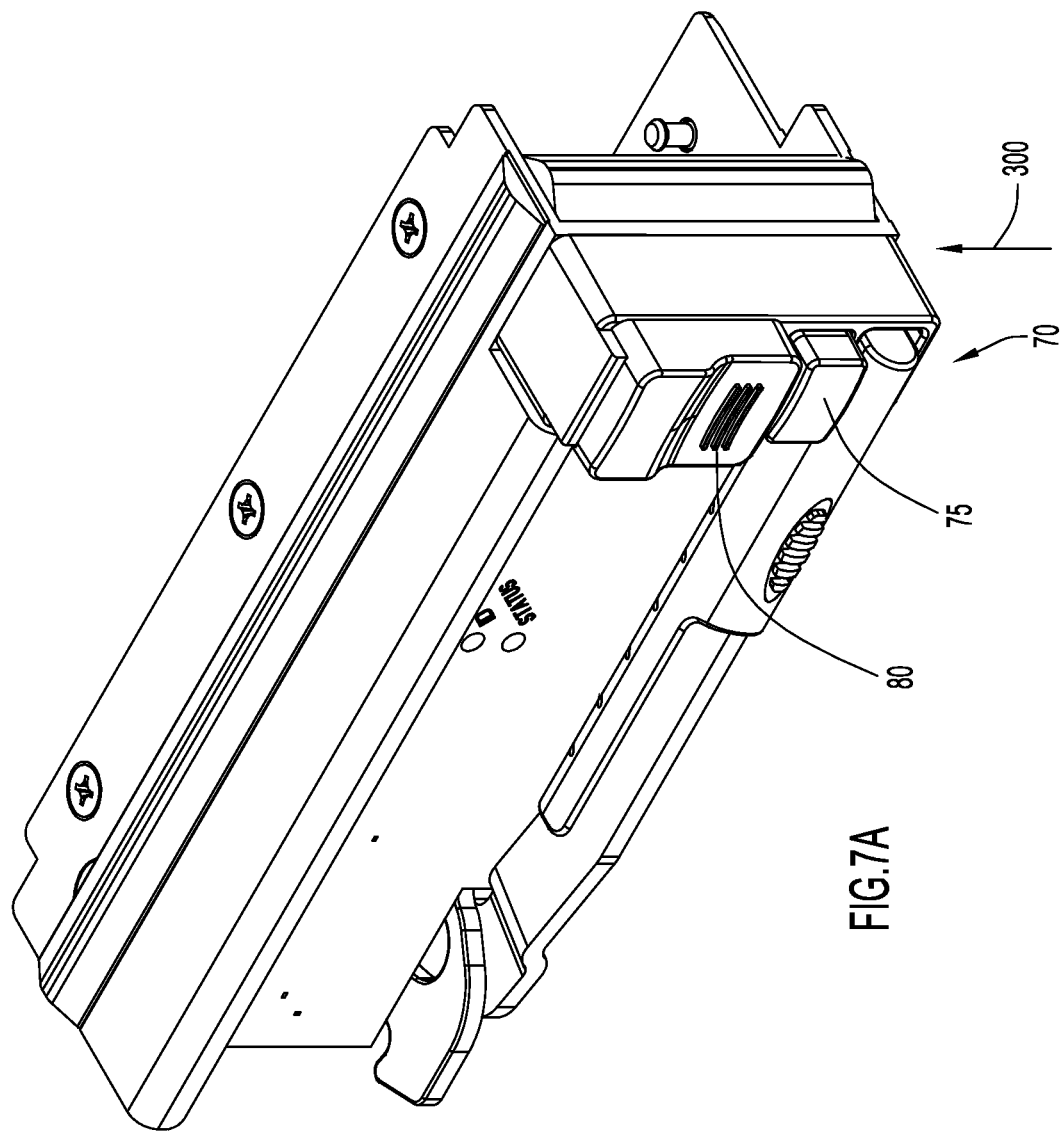
FIGS. 7A and 7B are perspective views of the line card having the dual-cam ejector assembly that illustrate actuation of a lock mechanism.

As noted above, FIG. 2A illustrates the ejector assembly 50 in a closed positioned. More specifically, in FIG. 2A, the lock mechanism 70 is engaged to prevent accidental release of the ejector arm 50. FIG. 7A illustrates a first step in the actuation of lock mechanism 70 and the release of ejector arm 55. More specifically, in FIG. 7A, a user slides protective button cover 80 upwards to expose ejector release button 75. The direction of movement of protective button cover 80 is generally shown by arrow 300. As shown in FIG. 7A, the ejector release button 75 is accessible and may be pressed by a user.

Figure 7B:
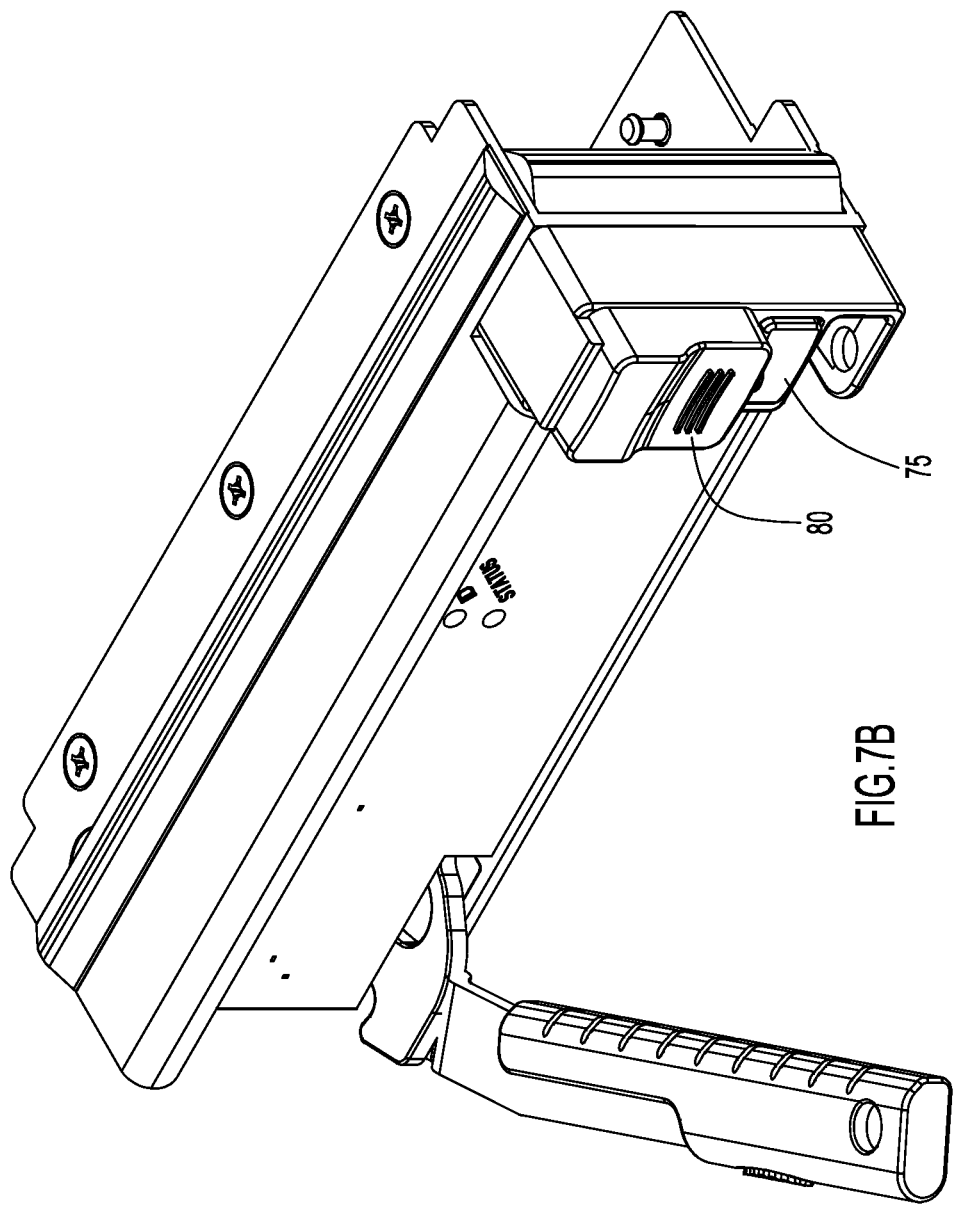

The next step in actuation of lock mechanism 70, as shown in FIG. 7B, includes pressing ejector release button 75. As noted above, as a result of the bias on ejector arm 55 by coil spring 135, pressing the ejector release button 75 causes ejector arm 55 to rotate around ejector arm pivot rivet 145 (i.e., the first axis of rotation).

The above description is intended by way of example only.

What is claimed is:

1. An apparatus comprising:
   a main body having disposed thereon one or more electrical components and one or more electrical edge connectors configured to be electrically connected to electrical connectors in a slot of a computing system;
   a front section attached to the main body; and
   a dual-cam ejector assembly disposed on the front section, wherein the dual-cam ejector assembly comprises: an elongated ejector arm comprising a proximal end and a distal end coupled to the front section so as to provide a first axis of rotation for the ejector arm; an ejector cam coupled to the front section so as to provide a second axis of rotation for the ejector cam that is substantially parallel to the first axis of rotation; and a cam pin extending from the ejector cam and configured to couple the ejector cam to the ejector arm such that pivoting of the ejector arm around the first axis of rotation causes the ejector cam to pivot around the second axis of rotation.

2. The apparatus of claim 1, wherein the distal end of the ejector arm comprises a substantially planar cam region having a key-hole slot disposed therein, wherein the key-hole slot comprises a circular pivot hole configured to receive an ejector arm pivot rivet that couples the elongated ejector arm to the front section, and wherein the key-hole slot comprises an elongated region extending from the pivot hole configured to receive the cam pin.

3. The apparatus of claim 1, wherein the ejector cam is a substantially planar element comprising:
   a pivot hole configured to receive a cam ejector pivot rivet configured to couple the ejector cam to the front section;
   a curved slot configured to receive the ejector arm pivot rivet and to provide clearance for rotation of the ejector arm around the first axis of rotation; and
   a jaw on the outer surface of the ejector cam.

4. The apparatus of claim 3, wherein the jaw comprises a generally rectangular slot in the outer surface of the ejector cam, and wherein the slot comprises first and second generally opposing surfaces connected by a third surface.

5. The apparatus of claim 4, wherein the first surface comprises a continuous curve to form a concave shape, and the second surface comprises an indent formed by one or more sharp curves.

6. The apparatus of claim 1, wherein the ejector assembly comprises a coil spring configured to apply a spring-bias on the ejector arm.

7. The apparatus of claim 6, further comprising:
a lock mechanism disposed on the front section, the lock mechanism comprising:
an ejector release button configured to oppose the spring-bias and to retain the ejector arm adjacent to the front section; and
a protective button cover that, when engaged, is configured to prevent actuation of the ejector release button.

8. The apparatus of claim 7, wherein the lock mechanism further comprises:
a receiver having opposing slide rails, wherein the protective button cover is configured to engage with, and slide along, the slide rails; and
a coil spring disposed in the receiver configured to bias the protective button cover in a position covering the ejector release button.

9. In combination, the apparatus of claim 1 and a computing system housing comprising a slot in which the apparatus is inserted, wherein when the ejector arm is rotated around the first axis of rotation, the cam pin causes rotation of the ejector cam such that a force is placed on a wall of the slot of the computing system.

10. An apparatus comprising:
a main body comprising one or more electrical components and one or more electrical edge connectors configured to be electrically connected to electrical connectors in a slot of a computing system;
a front section attached to the main body;
an ejector assembly disposed on the front section comprising an ejector arm; and
a lock mechanism disposed on the front section, the lock mechanism comprising:
an ejector release button configured to retain the ejector arm adjacent to the front section; and
a slideable protective button cover disposed over the ejector that, when engaged, is configured to prevent actuation of the ejector release button.

11. The apparatus of claim 10, wherein the lock mechanism further comprises:
a receiver having opposing slide rails, wherein the protective button cover is configured to engage with, and slide along, the slide rails; and
a coil spring disposed in the receiver configured to bias the protective button cover in a position covering the ejector release button.

12. The apparatus of claim 10, wherein the ejector assembly comprises a coil spring configured to apply a spring-bias on the ejector arm, and wherein the ejector release button is configured to oppose the spring bias so as to retain the ejector arm adjacent to the front section.

13. The apparatus of claim 10, wherein the ejector arm comprises a proximal end and a distal end coupled to the front section so as to provide a first axis of rotation for the ejector arm, and wherein the ejector assembly further comprises:
an ejector cam coupled to the front section so as to provide a second axis of rotation for the ejector cam that is substantially parallel to the first axis of rotation; and
a cam pin extending from the ejector cam and configured to couple the ejector cam to the ejector arm such that pivoting of the ejector arm around the first axis of rotation causes the ejector cam to pivot around the second axis of rotation.

14. The apparatus of claim 13, wherein the distal end of the ejector arm comprises a substantially planar cam region having a key-hole slot disposed therein, wherein the key-hole slot comprises a circular pivot hole configured to receive an ejector arm pivot rivet that couples the elongated ejector arm to the front section, and wherein the key-hole slot comprises an elongated region extending from the pivot hole configured to receive the cam pin.

15. The apparatus of claim 13, wherein the ejector cam is a substantially planar element comprising:
a pivot hole configured to receive a cam ejector pivot rivet configured to couple the ejector cam to the front section;
a curved slot configured to receive the ejector cam pivot rivet and to permit rotation of the ejector cam around the second axis of rotation; and
a jaw on the outer surface of the ejector cam.

16. The apparatus of claim 15, wherein the jaw comprises a generally rectangular slot in the outer surface of the ejector cam comprising first and second opposing surfaces connected by a third surface.

17. The apparatus of claim 16, wherein the first surface comprises a continuous curve to form a concave shape and the second surface comprises an indent formed by one or more sharp turns.

18. In combination, the apparatus of claim 13 and a computing system housing comprising a slot in which the apparatus is inserted, wherein when the ejector arm is rotated around the first axis of rotation, the cam pin causes rotation of the ejector cam such that a force is placed on a wall of the slot of the computing system.

19. An apparatus comprising:
an ejector assembly attached to a card, the ejector assembly comprising:
an elongated ejector arm comprising a proximal end and a distal end coupled to the front section so as to provide a first axis of rotation for the ejector arm;
an ejector cam coupled to the front section so as to provide a second axis of rotation for the ejector cam that is substantially parallel to the first axis of rotation; and
a cam pin extending from the ejector cam and configured to couple the ejector cam to the ejector arm such that pivoting of the ejector arm around the first axis of rotation causes the ejector cam to pivot around the second axis of rotation.

20. The apparatus of claim 19, wherein the distal end of the ejector arm comprises a substantially planar cam region having a key-hole slot disposed therein, wherein the key-hole slot comprises a circular pivot hole configured to receive an ejector arm pivot rivet that couples the elongated ejector arm to the front section, and wherein the key-hole slot comprises an elongated region extending from the pivot hole configured to receive the cam pin.

21. The apparatus of claim 19, wherein the ejector cam is a substantially planar element comprising:
a pivot hole configured to receive a cam ejector pivot rivet configured to couple the ejector cam to the front section;
a curved slot configured to receive the ejector arm pivot rivet and to provide clearance for rotation of the ejector arm around the first axis of rotation; and
a jaw on the outer surface of the ejector cam.

22. The apparatus of claim 21, wherein the jaw comprises a generally rectangular slot in the outer surface of the ejector cam, and wherein the slot comprises first and second generally opposing surfaces connected by a third surface.

23. The apparatus of claim 19, wherein the ejector assembly comprises a coil spring configured to apply a spring-bias on the ejector arm.

\* \* \* \* \*